US 8,058,911 B1

(12) United States Patent
Wright

(10) Patent No.: US 8,058,911 B1
(45) Date of Patent: Nov. 15, 2011

(54) PROGRAMMABLE POWER SUPERVISOR

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/005,775

(22) Filed: Dec. 27, 2007

Related U.S. Application Data

(60) Provisional application No. 60/906,605, filed on Mar. 12, 2007.

(51) Int. Cl.
*H03L 7/00* (2006.01)
(52) U.S. Cl. ..................................... 327/143; 327/198
(58) Field of Classification Search .................. 327/142, 327/143, 198
See application file for complete search history.

(56) References Cited

U.S. PATENT DOCUMENTS

| | | | |
|---|---|---|---|
| 4,727,514 A | 2/1988 | Bhuva et al. | |
| 4,734,885 A | 3/1988 | Luich | |
| 5,163,146 A | 11/1992 | Antanaitis et al. | |
| 5,336,951 A | 8/1994 | Josephson et al. | |
| 5,369,703 A | 11/1994 | Archibald et al. | |
| 5,376,834 A * | 12/1994 | Carobolante ................ | 327/143 |
| 5,418,969 A | 5/1995 | Matsuzaki et al. | |
| 5,481,549 A | 1/1996 | Tokuyama | |
| 5,568,083 A * | 10/1996 | Uchiyama et al. ............. | 327/538 |
| 5,594,442 A | 1/1997 | Paulos et al. | |
| 5,629,635 A | 5/1997 | Reno | |
| 5,661,685 A | 8/1997 | Lee et al. | |
| 5,664,205 A | 9/1997 | O'Brien et al. | |
| 5,693,570 A | 12/1997 | Cerneas et al. | |
| 5,726,995 A | 3/1998 | Wong | |
| 5,748,684 A | 5/1998 | Sanchez | |
| 5,838,950 A | 11/1998 | Young et al. | |
| 5,877,719 A | 3/1999 | Matsui et al. | |
| 5,878,234 A | 3/1999 | Dutkiewicz et al. | |
| 5,925,110 A | 7/1999 | Klein | |
| 6,038,400 A | 3/2000 | Bell et al. | |
| 6,105,155 A | 8/2000 | Cheng et al. | |
| 6,182,163 B1 | 1/2001 | Yamashita et al. | |
| 6,191,614 B1 | 2/2001 | Schultz et al. | |
| 6,195,712 B1 | 2/2001 | Pawlowski et al. | |
| 6,253,268 B1 | 6/2001 | Bjorkengren et al. | |

(Continued)

FOREIGN PATENT DOCUMENTS

EP 0619548 A1 10/1994

OTHER PUBLICATIONS

U.S. Appl. No. 11/691,676; "Interface Circuit and Method for Programming or Communicating with an Integrated Circuit via a Power Supply Pin," David G. Wright, filed on Mar. 27, 2007; 44 pages.

(Continued)

*Primary Examiner* — Lincoln Donovan
*Assistant Examiner* — William Hernandez

(57) ABSTRACT

A programmable power-on reset circuit in accordance with one embodiment of the invention can include a programmable voltage divider. The programmable power-on reset circuit can also include a comparator that is coupled to the programmable voltage divider and that is coupled to receive a reference voltage. Additionally, the programmable power-on reset circuit can include a non-volatile memory that is coupled to the programmable voltage divider, wherein the non-volatile memory can be coupled to receive programming for controlling an output of the programmable voltage divider.

11 Claims, 9 Drawing Sheets

U.S. PATENT DOCUMENTS

| | | | |
|---|---|---|---|
| 6,256,240 | B1 | 7/2001 | Shinozaki |
| 6,260,139 | B1 | 7/2001 | Alfke |
| 6,298,448 | B1 | 10/2001 | Shaffer et al. |
| 6,330,231 | B1 | 12/2001 | Bi |
| 6,400,605 | B1 | 6/2002 | Adkins |
| 6,429,682 | B1 | 8/2002 | Schultz et al. |
| 6,499,123 | B1 | 12/2002 | McFarland et al. |
| 6,509,845 | B1 | 1/2003 | Tanaka |
| 6,577,157 | B1 | 6/2003 | Cheung et al. |
| 6,577,175 | B2 | 6/2003 | Kim et al. |
| 6,798,254 | B2* | 9/2004 | Marshall et al. ............. 327/68 |
| 6,865,113 | B2 | 3/2005 | Voicu et al. |
| 6,912,606 | B2 | 6/2005 | Fay |
| 6,924,790 | B1 | 8/2005 | Bi |
| 6,999,342 | B2 | 2/2006 | Ooishi |
| 7,089,434 | B2 | 8/2006 | Kuo |
| 7,096,137 | B2 | 8/2006 | Shipton et al. |
| 7,174,144 | B2* | 2/2007 | Lin ............. 455/258 |
| 7,176,726 | B2 | 2/2007 | Bock |
| 7,224,801 | B2 | 5/2007 | Abdo et al. |
| 7,228,476 | B2 | 6/2007 | Scipioni et al. |
| 7,269,780 | B2 | 9/2007 | Arima et al. |
| 7,304,923 | B2 | 12/2007 | Sano et al. |
| 7,310,757 | B2 | 12/2007 | Ngo et al. |
| 7,392,409 | B2 | 6/2008 | Tateyama |
| 7,392,447 | B2 | 6/2008 | Tang et al. |
| 7,415,624 | B2 | 8/2008 | Miller et al. |
| 7,415,647 | B2 | 8/2008 | Yee |
| 7,421,291 | B2 | 9/2008 | Karaoguz et al. |
| 7,496,692 | B2 | 2/2009 | Holm et al. |
| 7,508,242 | B2 | 3/2009 | Tokuno |
| 7,626,576 | B2 | 12/2009 | Anandakumar et al. |
| 7,672,258 | B1 | 3/2010 | Wu et al. |
| 7,710,939 | B2 | 5/2010 | Shao et al. |
| 7,739,529 | B2 | 6/2010 | Hardman et al. |
| 7,760,655 | B2 | 7/2010 | Wilhelm |
| 7,795,893 | B2 | 9/2010 | Agatsuma |
| 7,802,212 | B2 | 9/2010 | Best et al. |
| 7,844,308 | B2 | 11/2010 | Rhee et al. |
| 2002/0108011 | A1 | 8/2002 | Tanha |
| 2003/0031320 | A1 | 2/2003 | Fan et al. |
| 2003/0074364 | A1 | 4/2003 | Sewall et al. |
| 2003/0093751 | A1 | 5/2003 | Hohl |
| 2005/0071730 | A1 | 3/2005 | Moyer et al. |
| 2005/0093572 | A1 | 5/2005 | Sun et al. |
| 2006/0035590 | A1 | 2/2006 | Morris et al. |
| 2006/0212838 | A1 | 9/2006 | Carson et al. |
| 2006/0236147 | A1* | 10/2006 | Best et al. ............. 713/400 |
| 2007/0183205 | A1* | 8/2007 | Lee ............. 365/185.18 |
| 2008/0071972 | A1 | 3/2008 | Kimura |
| 2008/0086626 | A1 | 4/2008 | Jones et al. |
| 2009/0167093 | A1* | 7/2009 | Nguyen et al. ............. 307/80 |

OTHER PUBLICATIONS

USPTO Advisory Action for U.S. Appl. No. 11/691,676 dated Aug. 5, 2009; 3 pages.

USPTO Final Rejection for U.S. Appl. No. 11/691,676 dated May 27, 2009; 10 pages.

USPTO Non-Final Rejection for U.S. Appl. No. 11/691,676 dated Nov. 28, 2008; 8 pages.

USPTO Requirement for Restriction/Election for U.S. Appl. No. 11/691,676 dated Aug. 1, 2008; 6 pages.

U.S. Appl. No. 12/005,768: "Intelligent Power Supervisor," David G. Wright, filed on Dec. 27, 2007; 43 pages.

USPTO Non-Final Rejection for U.S. Appl. No. 12/005,768 dated Aug. 20, 2009; 7 pages.

USPTO Requirement for Restriction/Election for U.S. Appl. No. 12/005,768 dated May 11, 2009; 6 pages.

U.S. Appl. No. 11/973,090: "Intelligent Voltage Regulatory," David G. Wright, filed on Oct. 4, 2007; 51 pages.

U.S. Appl. No. 12/005,774: "Intelligent Serial Interface," David G. Wright, filed on Dec. 28, 2007; 30 pages.

U.S. Appl. No. 12/005,748: "Firmware Memory of an Integrated Circuit," David G. Wright, filed on Dec. 28, 2007, 31 pages.

U.S. Appl. No. 12/005,950: "Ultra Low Power Sleep Mode," David G. Wright, filed on Dec. 28, 2007: 30.

U.S. Appl. No. 12/005,743: "Acquiring a Mode of an Integrated Circuit," David G. Wright, filed on Dec. 27, 2007; 33 pages.

U.S. Appl. No. 12/075,632: "Interrupt Latency Reduction," David G. Wright, filed on Mar. 12, 2008; 31.

USPTO Non-Final Rejection U.S. Appl. No. 12/075632 dated Jun. 24, 2009; 6 pages.

U.S. Appl. No. 12/075,633: "Encoded Acknowledge Signal for Wireless Communication," David G. Wright, filed on Mar. 12, 2008; 28 pages.

U.S. Appl. No. 12/075,748: "Secure Wireless Transmission," David G. Wright, filed on May 12, 2008; 25 pages.

U.S. Appl. No. 11/973,038: "Programmable Voltage Regulator," David G. Wright, filed on Oct. 4, 2007, 51 pages.

USPTO Final Rejection for U.S. Appl. No. 11/691,676 dated Feb. 26, 2010; 11 pages.

USPTO Non-Final Rejection for U.S. Appl. No. 11/691,676 dated Oct. 20, 2009; 11 pages.

USPTO Non-Final Rejection for U.S. Appl. No. 12/005,768 dated Feb. 16, 2010; 8 pages.

USPTO Non-Final Rejection for U.S Appl. No. 11/973,038 dated Oct. 23, 2009; 5 pages.

USPTO Final Rejection for U.S. Appl. No. 11/973,090 dated Mar. 9, 2010; 7 pages.

USPTO Non-Final Rejection for U.S. Appl. No. 11/973,090 dated Sep. 21, 2009; 7 pages.

USPTO Non-Final Rejection for U.S. Appl. No. 12/005,774 dated Sep. 15, 2009; 12 pages.

USPTO Final Rejection for U.S. Appl. No. 12/075,632 dated Feb. 3, 2010; 9 pages.

National Semiconductor, "54150/DM54150/DM741150, 54151A/DM54151A/DM74151A Data Selectors/Multiplexers," Datasheet, Jun. 1989, Downloaded from <www.DatasheetCatalog.com>, pp. 1-10; 11 pages.

USPTO Final Rejection for U.S. Appl. No. 11/973,038 dated Mar. 25, 2010; 5 pages.

USPTO Final Rejection for U.S. Appl. No. 12/005,774 dated Mar. 23, 2010; 14 pages.

USPTO Non-Final Rejection for U.S. Appl. No. 12/005,748 dated May 11, 2010; 14 pages.

USPTO Non-Final Rejection for U.S. Appl. No. 12/075,633 dated Apr. 26, 2010; 11 pages.

USPTO Non-Final Rejection for U.S. Appl. No. 12/075,632 dated May 25, 2010; 9 pages.

USPTO Notice of Allowance for U.S. Appl. No. 11/691,676 dated Jun. 24, 2010; 10 pages.

USPTO Notice of Allowance for U. S. Appl. No. 12/005,768 dated Jun. 28, 2010; 6 pages.

USPTO Non-Final Rejection for U.S. Appl. No. 11/973,090 dated Jun. 22, 2010; 7 pages.

USPTO Non-Final Rejection for U.S. Appl. No. 11/973,038 dated Jul. 1, 2010; 5 pages.

USPTO Non-Final Rejection for U.S. Appl. No. 12/005,743 dated Jun. 7, 2010; 11 pages.

Baldoni et al., "Properties of Communication Modes in Distributed Systems," Algorithms and Architectures for Parallel Processing, 1995, ICAPP 95, IEEE First ICA/sup 3/PP., IEEE First International Conference on, vol. 2, No., pp. 501-504, vol. 2, Apr. 19-21, 1995, doi: 10.1109/ICAPP.1995.472232; 4 pages.

Wong et al., "Flexible Test Mode Design for DRAM Characterization," 1996 Symposium on VLSI Circuits Digest of Technical Papers, vol., No., pp. 194-195, Jun. 13-15, 1996, doi: 10.1109/VLSIC.1996.507768; 2 pages.

The Authoritative Dictionary of IEEE Standard Terms, Seventh Edition, 2000, (selected definitions) ISBN 0738126012; 6 pages.

USPTO Non-Final Rejection for U.S. Appl. No. 12/005,768 dated Oct. 1, 2010; 7 pages.

USPTO Final Rejection for U.S. Appl. No. 11/973,038 dated Oct. 13, 2010; 5 pages.

USPTO Notice of Allowance for U.S. Appl. No. 11/973,090 dated Sep. 30, 2010; 6 pages.

USPTO Non-Final Rejection for U.S. Appl. No. 12/005,774 dated Oct. 27, 2010; 14 pages.

USPTO Final Rejection for U.S. Appl. No. 12/075,632 dated Nov. 26, 2010; 10 pages.
USPTO Final Rejection for U.S. Appl. No. 12/005,748 dated Sep. 24, 2010; 15 pages.
USPTO Final Rejection for U.S. Appl. No. 12/075,633 dated Nov. 24, 2010; 13 pages.
USPTO Non-Final Rejection for U.S. Appl. No. 12/005,950 dated Sep. 13, 2010; 8 pages.
USPTO Non-Final Rejection for U.S. Appl. No. 12/075,633 dated Feb. 22, 2011; 12 pages.
USPTO Non-Final Rejection for U.S. Appl. No. 12/075,633 dated Feb. 17, 2011; 9 pages.
USPTO Final Rejection for U.S. Appl. No. 11/904,644 dated Jan. 21, 2011; 7 pages.
USPTO Advisory Action for U.S. Appl. No. 12/075,632 dated Feb. 4, 2011; 3 pages.
USPTO Non-Final Rejection for U.S. Appl. No. 11/904,644 dated Aug. 9, 2010; 7 pages.
USPTO Final Rejection for U.S. Appl. No. 12/005,774 dated Feb. 8, 2011; 12 pages.
USPTO Notice of Allowance for U.S. Appl. No. 11/973,038 dated Jan. 6, 2011; 6 pages.
USPTO Notice of Allowance for U.S. Appl. No. 12/005,775 dated Dec. 17, 2010; 6 pages.
USPTO Non-Final Rejection for U.S. Appl. No. 12/005,950 dated Feb. 17, 2011; 9 pages.
USPTO Non-Final Rejection for U.S. Appl. No. 11/904,644 dated Jun. 24, 2011; 7 pages.
USPTO Advisory Action for U.S. Appl. No. 11/904,644 dated Mar. 28, 2011; 2 pages.
USPTO Notice of Allowance for U.S. Appl. No. 12/005,768 dated Feb. 17, 2011; 7 pages.
USPTO Non-Final Rejection for U.S. Appl. No. 12/005,748 dated Mar. 18, 2011; 13 pages.
USPTO Non-Final Rejection for U.S. Appl. No. 12/075,748 dated Jun. 7, 2011; 10 pages.
USPTO Notice of Allowance for U.S. Appl. No. 11/904,643 dated Nov. 3, 2009; 7 pages.
USPTO Non-Final Rejection for U.S. Appl. No. 11/904,643 dated Apr. 3, 2009; 9 pages.

* cited by examiner

PROGRAMMABLE POWER SUPERVISOR

CROSS-REFERENCE TO RELATED APPLICATIONS

This patent application claims the benefit of the co-pending U.S. Provisional Patent Application No. 60/906,605 entitled "Programmable Intelligent Integrated Circuits", by David Wright et al., filed Mar. 12, 2007.

The present patent application is related to co-pending U.S. patent application Ser. No. 12/005,768, entitled "Intelligent Power Supervisor" by David G. Wright, filed on Dec. 27, 2007, which is hereby incorporated by reference.

The present patent application is related to co-pending U.S. patent application Ser. No. 11/691,676, entitled "Interface Circuit and Method for Programming or Communicating with an Integrated Circuit via a Power Supply Pin" by David G. Wright, filed on Mar. 27, 2007, which is hereby incorporated by reference.

BACKGROUND

Conventional power-on reset (POR) circuits are multi-stage circuit devices that provide a reset signal in response to an input supply voltage reaching or exceeding a reference voltage level. After the appropriate voltage level is detected, the reset signal is typically generated after some delay period. As such, a power-on reset circuit is rated based on its reference voltage and also based on its delay period.

It is pointed out that some conventional power-on reset circuits are configurable during the manufacturing stage (e.g., set in silicon) which enables easier establishment of their fixed operational reference voltage and their fixed operational delay period. Given this situation, conventionally suppliers of power-on reset circuits maintain and sell a different power-on reset circuit for each reference voltage/delay specification. Unfortunately, this leads to inventory issues as many different integrated circuits must be maintained, supported, and the like.

As such, it is desirable to address one or more of the above issues.

SUMMARY

A programmable power-on reset circuit in accordance with one embodiment of the invention can include a programmable voltage divider. The programmable power-on reset circuit can also include a comparator that is coupled to the programmable voltage divider and that is coupled to receive a reference voltage. Additionally, the programmable power-on reset circuit can include a non-volatile memory that is coupled to the programmable voltage divider, wherein the non-volatile memory can be coupled to receive programming for controlling an output of the programmable voltage divider.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "generating", "determining", "performing", "translating", "utilizing", "presenting", "incorporating", "producing", "retrieving", "outputting", or the like, can refer to the actions and processes of a computer system or electronic computing device, but is not limited to such. The computer system or electronic computing device can manipulate and transform data represented as physical (electronic) quantities within the computer system's registers and/or memories into other data similarly represented as physical quantities within the computer system memories and/or registers or other such information storage, transmission, or display devices. Some embodiments of the invention are also well suited to the use of other computer systems such as, for example, optical and virtual computers.

Figure 1:
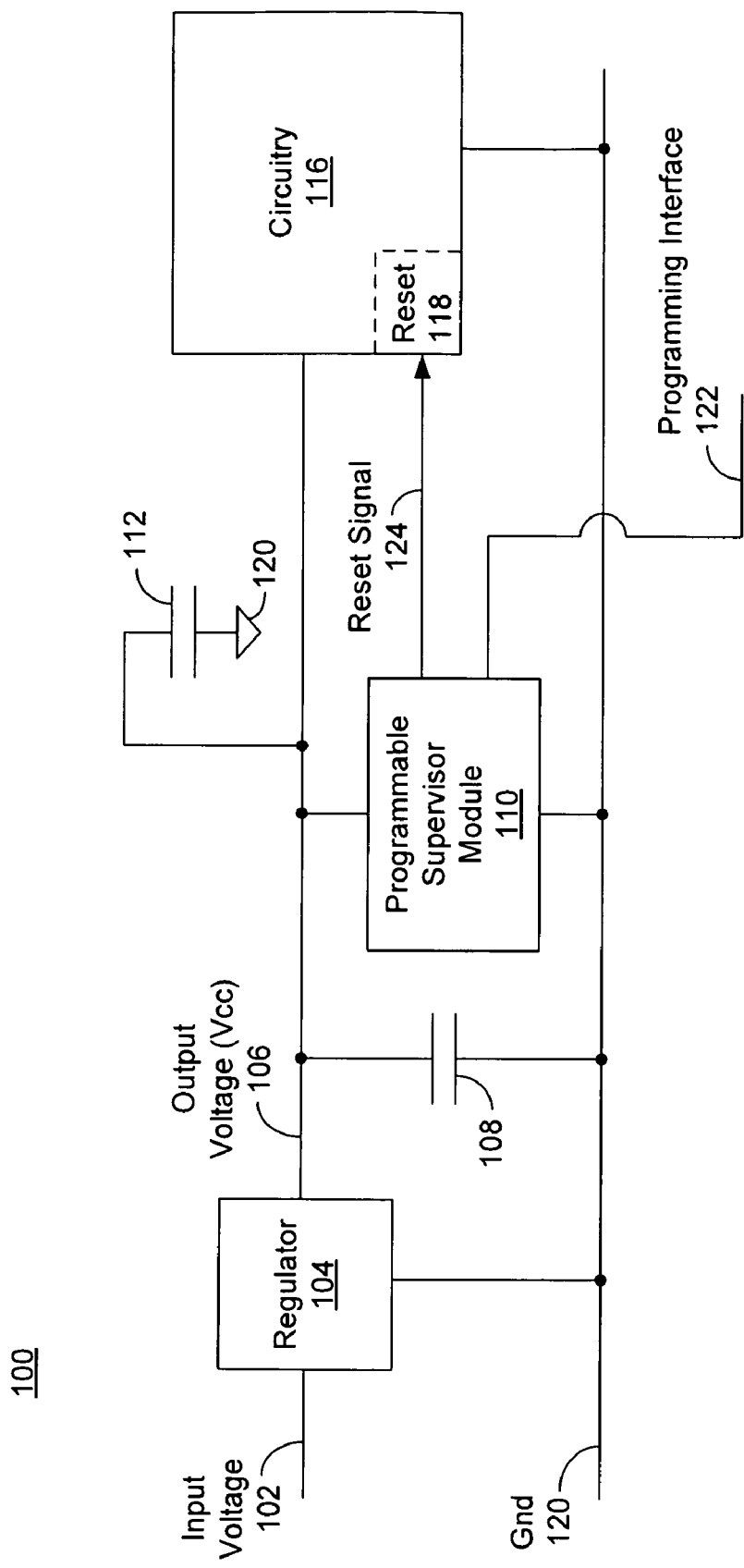
FIG. 1 is a diagram of an exemplary system in accordance with various embodiments of the invention.

FIG. 1 is a diagram of an exemplary system 100 in accordance with various embodiments of the invention. Specifically in one embodiment, the system 100 can include a programmable supervisor module 110, which can function as a power-on reset (POR) circuit that is programmable. For example in an embodiment, the programmable supervisor module 110 can have a programmable threshold reference voltage and also a programmable power-on delay. Furthermore, the programmable supervisor module 110 can be user programmable and also provide the functionality of being re-programmable. Note that the programmability may be accomplished by, but is not limited to, a user in the field thereby improving the ease of use of the programmable supervisor module 110 along with system 100. It is pointed out that by enabling this type of programmability, a single programmable power-on reset circuit (e.g., 110) can be maintained by a manufacturer and supplied to cover a wide range of voltage/delay specifications.

Specifically, the system 100 can include a programming interface 122 that can be coupled to the programmable supervisor module 110. As such, the programming of the programmable supervisor 110 can be implemented or accomplished over the programming interface 122 (e.g., a serial interface, a serial communication bus, an Inter-Integrated Circuit ($I^2C$) communication bus, a Serial Peripheral Interface (SPI) Bus, Dallas 1-wire bus, Microwire® (μWire), but is not limited to such). In an embodiment, the programmable supervisor module 110 can be programmed via the supply voltage 106 utilizing modulation. For example, the programmable supervisor module 110 can be programmed via its supply voltage 106 in any manner similar to that described by the co-pending U.S. patent application Ser. No. 11/691,676, entitled "Interface Circuit and Method for Programming or Communicating with an Integrated Circuit via a Power Supply Pin" by David G. Wright, filed on Mar. 27, 2007, which is hereby incorporated by reference. Once programmed, the configuration information for the programmable supervisor 110 may be stored by non-volatile memory, e.g., flash memory (not shown in FIG. 1).

Within FIG. 1, the system 100 can include a voltage regulator 104, which includes a voltage input 102 and a voltage output 106. Note that in one embodiment, voltage regulator 104 and input voltage 102 can be replaced by one or more batteries. In FIG. 1, the output voltage 106 of the voltage regulator 104 can be the voltage source (Vcc) for one or more circuits. For example in the system 100, the output voltage 106 can be the voltage source for circuitry 116, the programmable supervisor module 110, and capacitors 108 and 112 of system 100. Note that circuitry 116 can be implemented in a wide variety of ways. For example, circuitry 116 can be implemented as, but is not limited to, a central processing unit (CPU), a digital application-specific integrated circuit (ASIC), one or more circuits that do not including a CPU, or one or more circuits that include a CPU. Note that in one embodiment, it is desirable to hold the circuitry 116 in a reset mode until the output voltage 106 is stable. The system 100 can include a capacitor 108 that is coupled to the output voltage 106 of the voltage regulator 104. Furthermore, the system 100 can also include a decoupling capacitor 112 that can be located close to the circuitry 116 in order to decouple the output voltage 106. The programmable supervisor 110 can generate a reset signal 124 (e.g., logic "1" or zero), which can be utilized to hold all or part of the circuitry 116 and/or other circuits in a reset mode.

For example in one embodiment, in order to have the programmable supervisor module 110 operate as a 3.0 volt supervisor, the programmable supervisor 110 can be programmed to have a specific nominal threshold reference voltage (e.g., 3.05 volts) and an accuracy or tolerance (e.g., +/−50 mV). As such, whenever the output voltage 106 is below 3.0 volts, the programmable supervisor 110 asserts the reset signal 124 which can be received by the circuitry 116. Additionally in an embodiment, the programmable supervisor 110 can be programmed to have a specific power-on reset delay period, e.g., 500 microseconds (μs). Therefore, after the programmable supervisor 110 detects that the output voltage is above 3.0 volts, having previously been below 3.0V, the reset signal 124 can be de-asserted by the programmable supervisor 110 after the elapse of the programmed delay period (e.g., 500 μs). Moreover in an embodiment, the programmable supervisor 110 can be programmed to have a glitch rejection period (e.g., 10 μs). As such, if the output voltage 106 drops below the threshold reference voltage level of 3.05+/−0.05 volts (for example) for at least the length of the programmed glitch rejection period (e.g., 10 μs), the programmable supervisor 110 can assert the reset signal 124. However, if the output voltage 106 rises above the 3.05+/−0.05 volt reference voltage threshold before the elapse of the programmed glitch rejection period (e.g., 10 μs), the programmable supervisor 110 will not assert the reset signal 124. It is pointed out that the threshold reference voltage, power-on delay period, and glitch rejection period of the programmable supervisor 110 can be programmed in-field and in system, but is not limited to such. Furthermore, in an embodiment, note that there is no communication from the circuitry 116 to the programmable supervisor 110. In this embodiment, the programmable supervisor 110 is a one way device from the viewpoint of the circuitry 116 (or any other device receiving the reset signal 124).

Within FIG. 1, it is noted that in an embodiment the programmable supervisor 110 can be implemented as a low voltage detect circuit. For example in one embodiment, the operating voltage ranges of the circuitry 116 is 3.0 volts to 3.6 volts with a nominal voltage of 3.3 volts. Additionally, the programmable supervisor 110 can be programmed with a reference threshold voltage of 3.05+/−0.05 volts along with an early warning threshold voltage of 3.1+/−0.05 volts. As such, if the programmable supervisor 110 detects that the output voltage 106 is equal or less than the early warning threshold voltage, the programmable supervisor 110 can output an interrupt signal (e.g., similar to reset signal 124) in order to alert the circuitry 116 that the voltage 106 may drop below the reset threshold voltage. Therefore, the circuitry 116 can avoid performing one or more operations that would be undesirable to abandon part way through if the voltage 106 fell below the reset threshold voltage.

The system 100 can include, but is not limited to, the voltage regulator circuit 104, programmable supervisor module 110, circuitry 116, programming interface 122, and capacitors 108 and 112. Specifically, the voltage regulator circuit 104 can include a voltage input 102 and a voltage output 106, which can have a positive voltage value. The voltage output 106 of the voltage regulator can be coupled to a first terminal of the capacitor 108, a first terminal of the programmable supervisor 110, a first terminal of the capacitor 112, and a first terminal of the circuitry 116. Furthermore, the system 100 can include a voltage ground (Gnd) 120. The voltage ground 120 can be coupled to a third terminal of the voltage regulator 104, a second terminal of the capacitor 108, a second terminal of the programmable supervisor 110, and a second terminal of the circuitry 116. A third terminal of the programmable supervisor 110 can be coupled to a reset input 118 of the circuitry 116. As such, the programmable supervisor 110 can output and the circuitry 116 can receive the reset signal 124. Additionally, the programming interface 122 can be coupled to the programmable supervisor module 110.

Within FIG. 1, it is pointed out that the programmable supervisor module 110 can provide different advantages and benefits. For example, the programmable supervisor module 110 enables a manufacturer to fabricate and store a single device that can be programmed in an independent stage before being incorporated on circuit board. Furthermore, the programmable supervisor module 110 enables one to program it with automatic test equipment during test of system 100. As such, as part of the automatic test process, the tester equipment could actually program the programmable supervisor module 110.

Note that the programmable supervisor module 110 can be combined with other circuits and/or circuit elements. For example in one embodiment, a programmable microcontroller (e.g., a PSOC microcontroller) may be used as a platform for the programmable supervisor module 110 and/or the system 100. It is noted that the PSOC microcontroller is available from Cypress Semiconductor of San Jose, Calif. In an embodiment in accordance with the invention, non-volatile memory can be utilized in combination with the programmable supervisor module 110. As such, the programmable supervisor module 110 can be coupled to the non-volatile memory in order to utilize it. The non-volatile memory can be implemented in a wide variety of ways. For example, the non-volatile memory can be, but is not limited to, electrically erasable programmable read only memory (EEPROM), flash memory, erasable programmable read only memory (EPROM), and the like.

In one embodiment, the programmable supervisor module 110 of FIG. 1 can be implemented as a stand alone supervisor device. It is noted that by stand alone, it can mean that in an embodiment of the programmable supervisor 110 can be utilized just to generate a reset signal (e.g., 124).

Within FIG. 1, it is understood that the system 100 may not include all of the elements illustrated by FIG. 1. Additionally, the system 100 can be implemented to include one or more elements not illustrated by FIG. 1.

Figure 2:
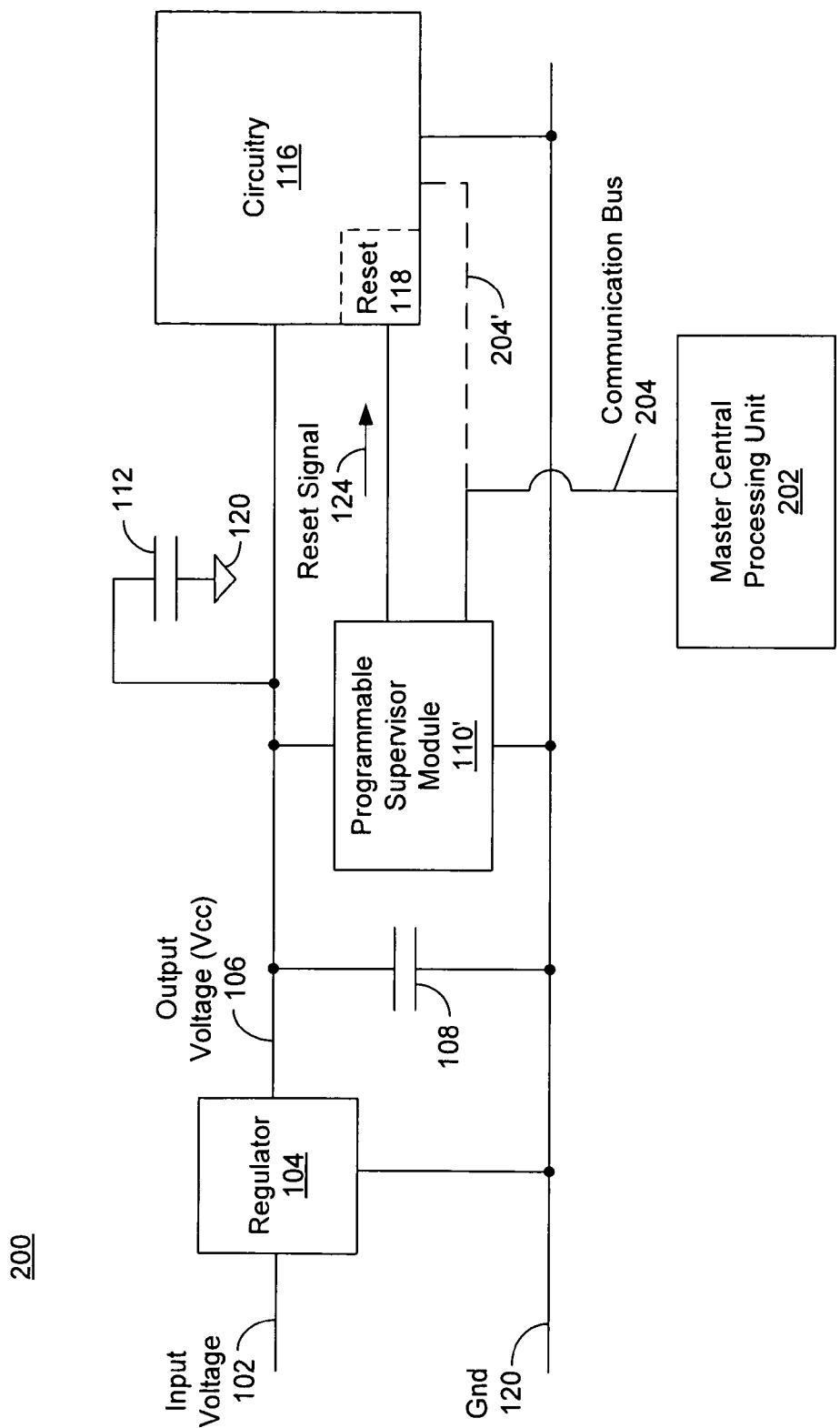
FIG. 2 is a diagram of another exemplary system in accordance with various embodiments of the invention.

FIG. 2 is a diagram of an exemplary system 200 in accordance with various embodiments of the invention. Specifically in one embodiment, the system 200 can be implemented to include multiple central processing units (e.g., 116 and master CPU 202) along with a programmable supervisor module 110, which can function as a power-on reset (POR) circuit that is programmable. It is pointed out that the elements of system 200 having the same reference numbers as the elements of system 100 of FIG. 1 can operate or function in any manner similar to that described herein, but are not limited to such.

Within system 200, the programmable supervisor module 110' can have an external "force reset" input. For example in an embodiment, a master CPU 202 can be implemented with the ability to force a reset of the programmable supervisor module 110'. This can be implemented in a wide variety of ways. For example in one embodiment, the programmable supervisor module 110' may include a physical pin input (not shown) for receiving a command to assert reset signal 124 from the master CPU 202. In an embodiment, a communication bus 204 can couple the master CPU 202 to the programmable supervisor module 110'. As such, the master CPU 202 has the ability to transmit a command to assert reset signal 124 to the programmable supervisor module 110' via the communication bus 204 in order to force a reset of the circuitry 116. It is noted that the communication bus 204 can be implemented in a wide variety of ways. For example, the communication bus 204 can include, but is not limited to, a serial interface, a serial communication bus, an Inter-Integrated Circuit ($I^2C$) communication bus, a Serial Peripheral Interface (SPI) Bus, Dallas 1-wire bus, Microwire® (μWire), and the like. It is pointed out that the programmable supervisor module 110' can be configured such that in its default state it will not assert reset signal 124 and the master CPU 202 would enable the device. Once the power 106 comes up to the desired level, the programmable supervisor module 110' can output the reset signal 124 to the circuitry 116. Note that the master CPU 202 can still have the ability to write over the communication bus 204 a command for the programmable supervisor module 110' to generate the reset signal 124 (e.g., a one-off reset or a sustained reset until the master CPU 202 causes it to stop). In one embodiment, it is noted that the communication bus 204 can be utilized to couple the programmable supervisor module 110' with the circuitry 116 as indicated by dashed line 204'. As such, the programmable supervisor module 110' can transmit the reset signal 124 to the circuitry 116 via the communication bus 204.

Within FIG. 2, the system 200 can include, but is not limited to, a voltage regulator circuit 104, a programmable supervisor 110', a circuitry 116, a master central processing unit 202, and capacitors 108 and 112. Specifically, the voltage regulator circuit 104 can include a voltage input 102 and a voltage output 106, which can have a positive voltage value. The voltage output 106 of the voltage regulator can be coupled to a first terminal of the capacitor 108, a first terminal of the programmable supervisor 110', a first terminal of the capacitor 112, and a first terminal of the circuitry 116. Furthermore, the system 100 can include a voltage ground (Gnd) 120. The voltage ground 120 can be coupled to a third terminal of the voltage regulator 104, a second terminal of the capacitor 108, a second terminal of the programmable supervisor 110', and a second terminal of the circuitry 116. A third terminal of the programmable supervisor 110' can be coupled to a reset input 118 of the circuitry 116. As such, the programmable supervisor 110 can output and the circuitry 116 can receive the reset signal 124. Additionally, the master CPU 202 can be coupled to the programmable supervisor module 110' via the communication bus 204.

It is pointed out that the system 200 may not include all of the elements illustrated by FIG. 2. Additionally, the system 200 can be implemented to include one or more elements not illustrated by FIG. 2.

Figure 3:
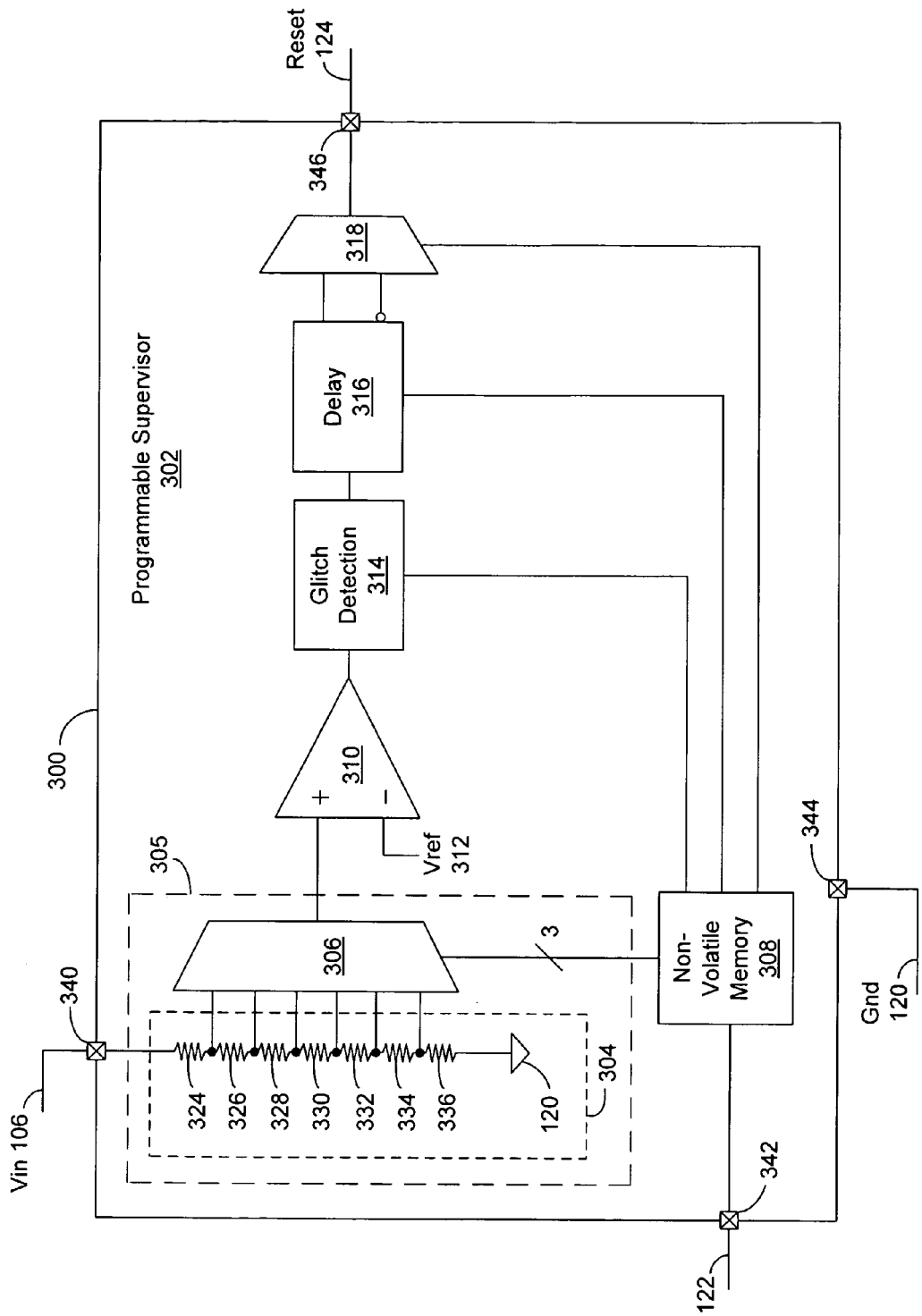
FIG. 3 is a diagram of an exemplary programmable supervisor circuit in accordance with various embodiments of the invention.

FIG. 3 is schematic diagram of an exemplary programmable supervisor circuit 302 in accordance with various embodiments of the invention. Note that the programmable supervisor circuit 302 can be implemented as part of an integrated circuit 300. It is pointed out that the elements of FIG. 3 having the same reference numbers as the elements of any other figure can operate or function in any manner similar to that described herein, but are not limited to such. In an embodiment, the programmable supervisor circuit 302 can be an implementation of the programmable supervisor module 110 of FIG. 1. The programmable supervisor circuit 302 of FIG. 3 can include, but is not limited to, a voltage divider 304, a multiplexer 306, non-volatile memory 308, a comparator 310, a glitch detector 314, a delay 316, and a multiplexer 318. Note that the voltage divider 304 can be implemented in a wide variety of ways. For example, the voltage divider 304 can be implemented as, but is not limited to, a resistor ladder as shown in FIG. 3. Additionally in an embodiment, the resistor ladder of voltage divider 304 can include multiple resistors (e.g., 324, 326, 328, 330, 332, 334 and 336) that can each have different impedance (or resistance) values, approximately the same impedance (or resistance) values, or any combination thereof. Furthermore in an embodiment, the resistor ladder of voltage divider 304 can include more or less resistors than shown in FIG. 3. Note that a communication interface 122 can be coupled to the non-volatile memory 308. It is pointed out that the programmable supervisor circuit 302 can include a programmable voltage divider 305, which can be implemented in a wide variety of ways. For example in an embodiment, the programmable voltage divider 305 can include the voltage divider 304 and multiplexer 306, but is not limited to such.

The voltage supply (Vin) 106 can be coupled to a voltage supply pin 340 of the integrated circuit 300. As such, the voltage supply 106 powers the programmable supervisor circuit 302 and can also act as one of the voltages that are compared by the comparator 310. The voltage divider 304 is coupled to receive the voltage supply 106. The voltage divider 304 can include multiple taps which are coupled to multiple inputs of a multiplexer (MUX) 306. The output of the multiplexer 306 can be coupled to one of the inputs (e.g., non-inverting input) of the comparator 310. Additionally, a reference voltage (Vref) 312 can be coupled to the other input (e.g., inverting input) of the comparator 310. It is pointed out that the programming interface 122 is coupled to a programming interface pin 342 of the integrated circuit 300, which is coupled to the non-volatile memory 308. As such, the reference voltage threshold of the programmable supervisor circuit 302 can be programmed and stored by the non-volatile memory 308. Therefore, the non-volatile memory 308 can utilize the coupling between it and the multiplexer 306 in order to set or establish the threshold reference voltage with the voltage divider 304.

For example, if the reference voltage 312 was a bandgap voltage (e.g., 1.3 V), and there was a desire to set the threshold voltage at 2.9 V, then a tap in the voltage divider 304 can be selected where the ratio divider for 2.9 V input corresponds to a 1.3 V on the potential divider, thus crossing the threshold and tripping the trigger. The programmable supervisor circuit 302 can also include a glitch detection module 314 that can be coupled to the output of the comparator 310. Furthermore, the glitch detection module 314 can be coupled to the non-volatile memory 308. As such, the glitch detection module 314 can be programmed via the non-volatile memory 308, which can be programmed via the programming interface 122. In this manner, the glitch detection module 314 can be programmed with a glitch rejection that can include a duration (or interval) and a magnitude range of glitch to reject. As such, the glitch detection module 314 can override the output of the comparator 310 if the glitch detector 314 determines that the voltage signal output by the comparator 310 is a glitch. If the output of the comparator 310 is not overridden, the glitch detection module 314 can output the voltage signal that it received from the comparator 310. The programmable supervisor circuit 302 can also include a delay module 316 that is coupled to the output of the glitch detection module 314. Note that the delay module 316 can be configurable via the non-volatile memory 308, which can be programmed via the programming interface 122. As such, the power-on reset delay period of the programmable supervisor circuit 302 can be programmed and stored by the non-volatile memory 308. Therefore, the non-volatile memory 308 can utilize the coupling between it and the delay module 316 in order to set or establish the power-on reset delay period. The delay module 316 can include two outputs; one of which is inverting and the other that is non-inverting. A multiplexer 318 can be coupled to the outputs of the delay module 316. The output of the multiplexer 318 can be coupled to an output pin 346, which can be coupled to other things (e.g., the circuitry 116). It is noted that the output of the multiplexer 318 can output the reset signal 124. Note that the non-volatile memory 308 can be coupled to the multiplexer 318 thereby enabling which of the outputs of the delay module 316 to reach the output pin 346.

Within FIG. 3, it is pointed out that the programming interface 122 is coupled to the non-volatile memory 308. As such, this enables programming values and/or data to be written to the non-volatile memory 308 via the programming interface 122. In one embodiment in accordance with the invention, one or more watch-dog timers (not shown) can be included as part of the programmable supervisor circuit 302. The one or more watch-dog timers can be coupled to the non-volatile memory 308. As such, the one or more watch-dog timers could each be programmed or implemented with a count value via the non-volatile memory 308. The one or more watch-dog timer can operate in any manner similar to that described herein, but are not limited to such. In an embodiment in accordance with the invention, a portion of the non-volatile memory 308 can be reserved for one or more configuration states and another portion of the non-volatile memory 308 can be utilized for general purpose user non-volatile memory storage.

Within FIG. 3, it is understood that the programmable supervisor circuit 302 may not include all of the elements illustrated by FIG. 3. Additionally, the programmable supervisor circuit 302 can be implemented to include one or more elements not illustrated by FIG. 3.

Figure 4:
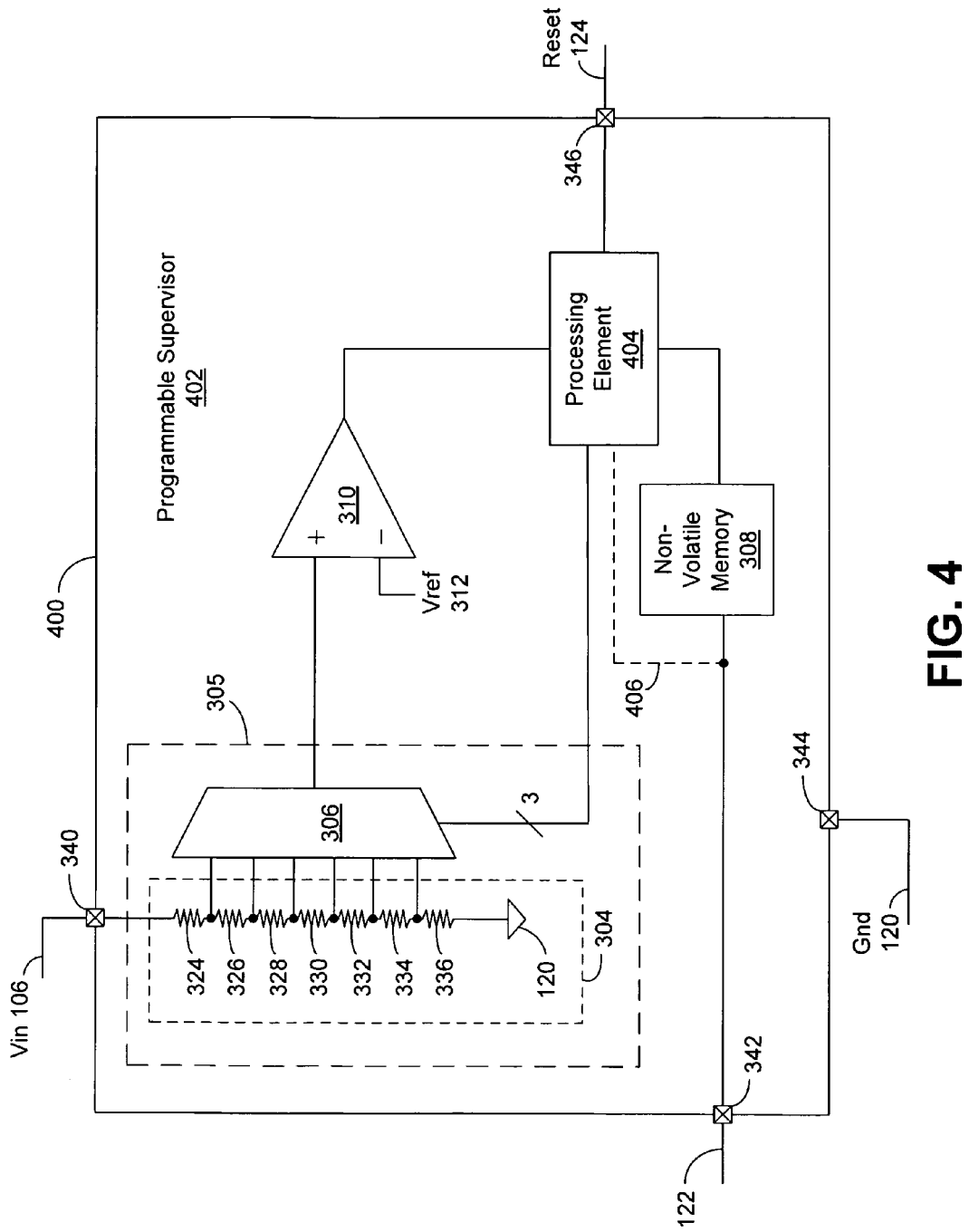
FIG. 4 is a diagram of another exemplary programmable supervisor circuit in accordance with various embodiments of the invention.

FIG. 4 is schematic diagram of an exemplary programmable supervisor circuit 402 in accordance with various embodiments of the invention. Note that the programmable supervisor circuit 402 can be implemented as part of an integrated circuit 400. It is pointed out that the elements of FIG. 4 having the same reference numbers as the elements of any other figure can operate or function in any manner similar to that described herein, but are not limited to such. In an embodiment, the programmable supervisor circuit 402 can be an implementation of the programmable supervisor module 110 of FIG. 1. The programmable supervisor circuit 402 of FIG. 4 can include, but is not limited to, voltage divider 304, multiplexer 306, processing element 404, non-volatile memory 308, and comparator 310. Note that in one embodiment the programming interface 122 can be coupled to the non-volatile memory 308 via the programming interface pin 342. In an embodiment, the programming interface 122 and programming interface pin 342 can be coupled to the processing element 404 as indicated by dashed line 406. It is noted that if the processing element 404 is coupled to the programming interface 122, then the processing element 404 can receive and manage the storing of any programming instructions, values and/or data within the non-volatile memory 308. The processing element 404 can be implemented in a wide variety of ways. For example, the processing element 404 can include, but is not limited to, a central processing unit, a microprocessor, any type of processing element that can execute instructions, and the like. It is pointed out that the programmable supervisor circuit 402 can include programmable voltage divider 305, which can be implemented in a wide variety of ways. For example in an embodiment, the programmable voltage divider 305 can include the voltage divider 304 and multiplexer 306, but is not limited to such.

It is pointed out that the processing element 404 can have access to the non-volatile memory 308. The processing element 404 can internally generate the delay and/or glitch detection functionality for the programmable supervisor circuit 402. As such, rather than having dedicated hardware circuits for these functionalities within the programmable supervisor circuit 402, the processing element 404 can perform all of the timing whether it is for the reset delay and/or for glitch detection. In an embodiment in accordance with the invention, a portion of the non-volatile memory 308 of the programmable supervisor circuit 402 can be reserved for one or more configuration states and another portion of the non-volatile memory 308 can utilized for general purpose user non-volatile memory storage.

Within FIG. 4, in an embodiment the processing element 404 can also implement watch-dog timer functionality for the programmable supervisor circuit 402. The watch-dog timer can be a timer that is running in the background of the programmable supervisor 402 and can ensure that any firmware and/or software that is running on the circuitry 116 (of FIG. 1)

has not begun operating incorrectly or "crashed". For example, the circuitry 116 can be programmed to periodically (e.g., every millisecond (ms), every 10 ms, every 100 ms, etc.) write to the watch-dog timer operating on the processing element 404, which resets its timer. However, if the watch-dog timer operating on the processing element 404 reaches its time-out count without having been reset, then the processing element 404 can generate a reset signal 124 that is received by the circuitry 116. In this manner, the watch-dog timer operating on the processing element 404 can provide a self recovery mechanism from that kind of situation. In an embodiment, the watch-dog timer operating on the processing element 404 does not actually assert a reset, but instead it can produce a watch-dog interrupt (which can be a separate interrupt request to the circuitry 116). In one embodiment, the watch-dog interrupt can be transmitted to an interrupt pin of the circuitry 116 or via a serial interface or communication bus (not shown).

In one embodiment in accordance with the invention, the programming interface 122 is used to program the programmable supervisor 402, but is not used during run time of the programmable supervisor 402. In an embodiment, if the non-volatile memory 308 is accessible for a user's general purpose, then the programming interface 122 can be used during the run time of the programmable supervisor 402.

Within FIG. 4, it is understood that the programmable supervisor circuit 400 may not include all of the elements illustrated by FIG. 4. Additionally, the programmable supervisor circuit 400 can be implemented to include one or more elements not illustrated by FIG. 4.

Figure 5:
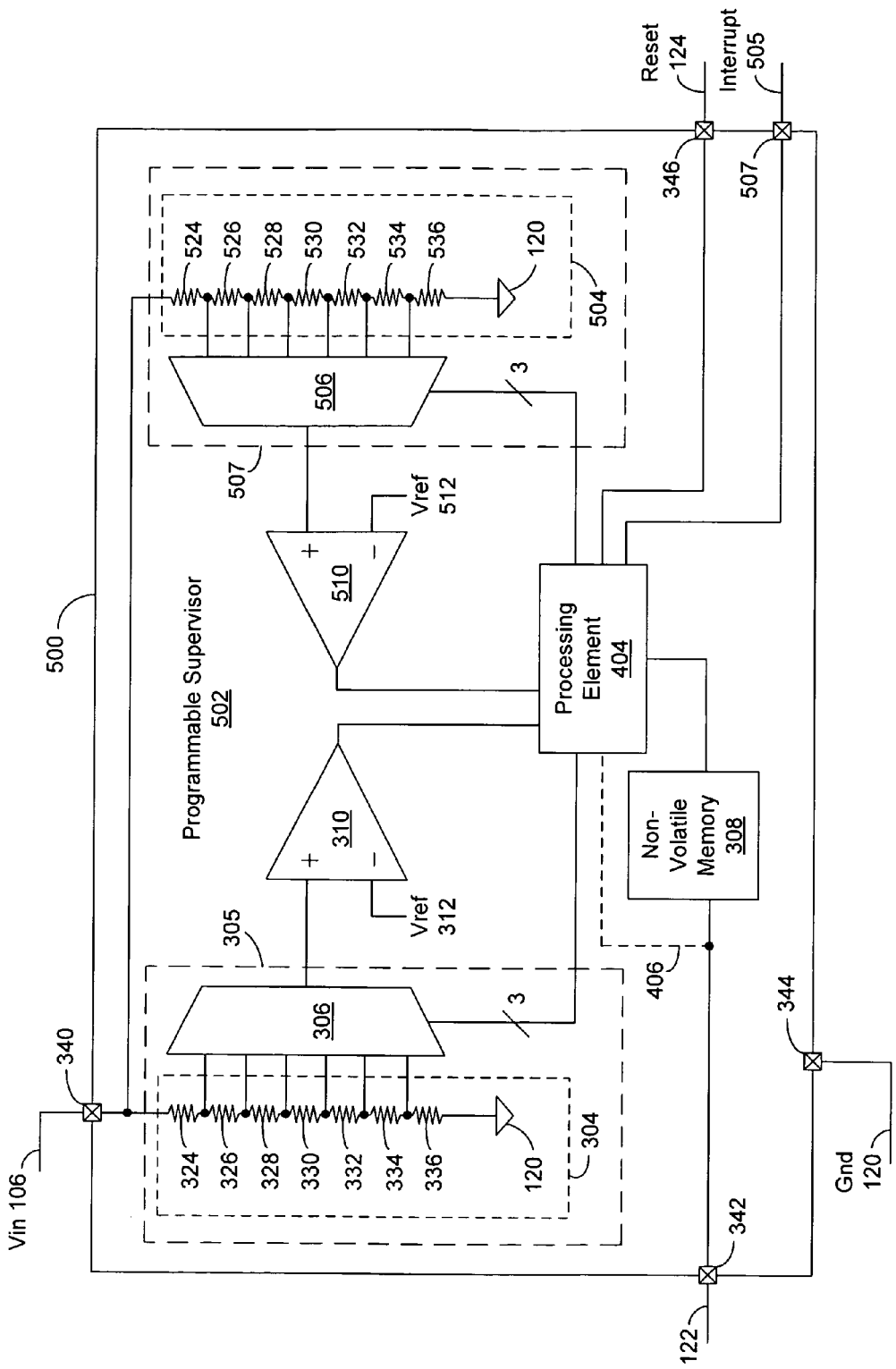
FIG. 5 is a diagram of yet another exemplary programmable supervisor circuit in accordance with various embodiments of the invention.

FIG. 5 is schematic diagram of an exemplary programmable supervisor circuit 502 in accordance with various embodiments of the invention. Note that the programmable supervisor circuit 502 can be implemented as part of an integrated circuit 500. It is pointed out that the elements of FIG. 5 having the same reference numbers as the elements of any other figure can operate or function in any manner similar to that described herein, but are not limited to such. In an embodiment, the programmable supervisor circuit 502 can be an implementation of the programmable supervisor module 110 of FIG. 1. The programmable supervisor circuit 502 of FIG. 5 can include, but is not limited to, voltage divider 304, multiplexer 306, processing element 404, non-volatile memory 308, comparator 310, voltage divider 504, multiplexer 506, and comparator 510. Note that in one embodiment the programming interface 122 can be coupled to the non-volatile memory 412 via the programming interface pin 342. In an embodiment, the programming interface 122 and programming interface pin 342 can be coupled to the processing element 404 as indicated by dashed line 406. It is noted that if the processing element 404 is coupled to the programming interface 122, then the processing element 404 can receive and manage the storing of any programming instructions, values and/or data within the non-volatile memory 308. It is pointed out that the programmable supervisor circuit 502 can include a programmable voltage divider 305, which can be implemented in a wide variety of ways. For example in an embodiment, the programmable voltage divider 305 can include the voltage divider 304 and multiplexer 306, but is not limited to such. Furthermore, the programmable supervisor circuit 502 can include a programmable voltage divider 507, which can be implemented in a wide variety of ways. For example in an embodiment, the programmable voltage divider 507 can include the voltage divider 504 and multiplexer 506, but is not limited to such.

Within the programmable supervisor circuit 502, the voltage divider 304, the multiplexer 306, the comparator 310 are utilized for the reset functionality while the voltage divider 504, the multiplexer 506, the comparator 510 are utilized to provide low voltage interrupt functionality. As such, the reset functionality can have one reference voltage (e.g., Vref 312) while the low voltage interrupt can have its reference voltage (e.g., Vref 512). Note that reference voltages 312 and 512 can be different voltage values or approximately the same voltage values. In this manner, in one embodiment, a low voltage interrupt signal 505 can be asserted while the reset signal 124 is not asserted, and vice versa. It is noted that the processing element 404 can be coupled to a low voltage interrupt pin of the integrated circuit 500, which enables the interrupt signal 505 to be output to the circuitry 116.

Within FIG. 5, note that the voltage divider 504 is coupled to receive the voltage supply 106. The voltage divider 504 can include multiple taps which are coupled to multiple inputs of a multiplexer (MUX) 506. The output of the multiplexer 506 can be coupled to one of the inputs (e.g., positive input) of the comparator 510. Additionally, a reference voltage (Vref) 512 can be coupled to the other input (e.g., negative input) of the comparator 510. The non-volatile memory 308 can utilize the coupling between it and the multiplexer 506 in order to set or establish the threshold reference voltage with the voltage divider 504. Note that the voltage divider 504 can be implemented in a wide variety of ways. For example, the voltage divider 504 can be implemented as, but is not limited to, a resistor ladder as shown in FIG. 5. Additionally in an embodiment, the resistor ladder of voltage divider 504 can include multiple resistors (e.g., 524, 526, 528, 530, 532, 534 and 536) that can each have different impedance (or resistance) values, approximately the same impedance (or resistance) values, or any combination thereof. Furthermore in an embodiment, the resistor ladder of voltage divider 504 can include more or less resistors than shown in FIG. 5. In one embodiment, the voltage divider 504, multiplexer 506, and comparator 510 can operate in any manner similar to the voltage divider 304, multiplexer 306, and comparator 310 as described herein, but are not limited to such.

It is understood that the programmable supervisor circuit 502 may not include all of the elements illustrated by FIG. 5. Additionally, the programmable supervisor circuit 502 can be implemented to include one or more elements not illustrated by FIG. 5.

With reference to FIGS. 1-5, in one embodiment, it is noted that the programmable supervisor 110 and 110' can enable a semiconductor supplier to sell a single part that can be programmed with multiple different operating settings. Furthermore, the programmable supervisor 110 and 110' can enable a customer to buy a single device that can be programmed to cover a range of different operating settings. Moreover, the programmable supervisor 110 and 110' can enable an end product manufacturer to have one part on inventory that can be programmed to cover a range of different operating settings, which can reduce the amount of inventory and can reduce the risk of not being able to get supply.

Figure 6:
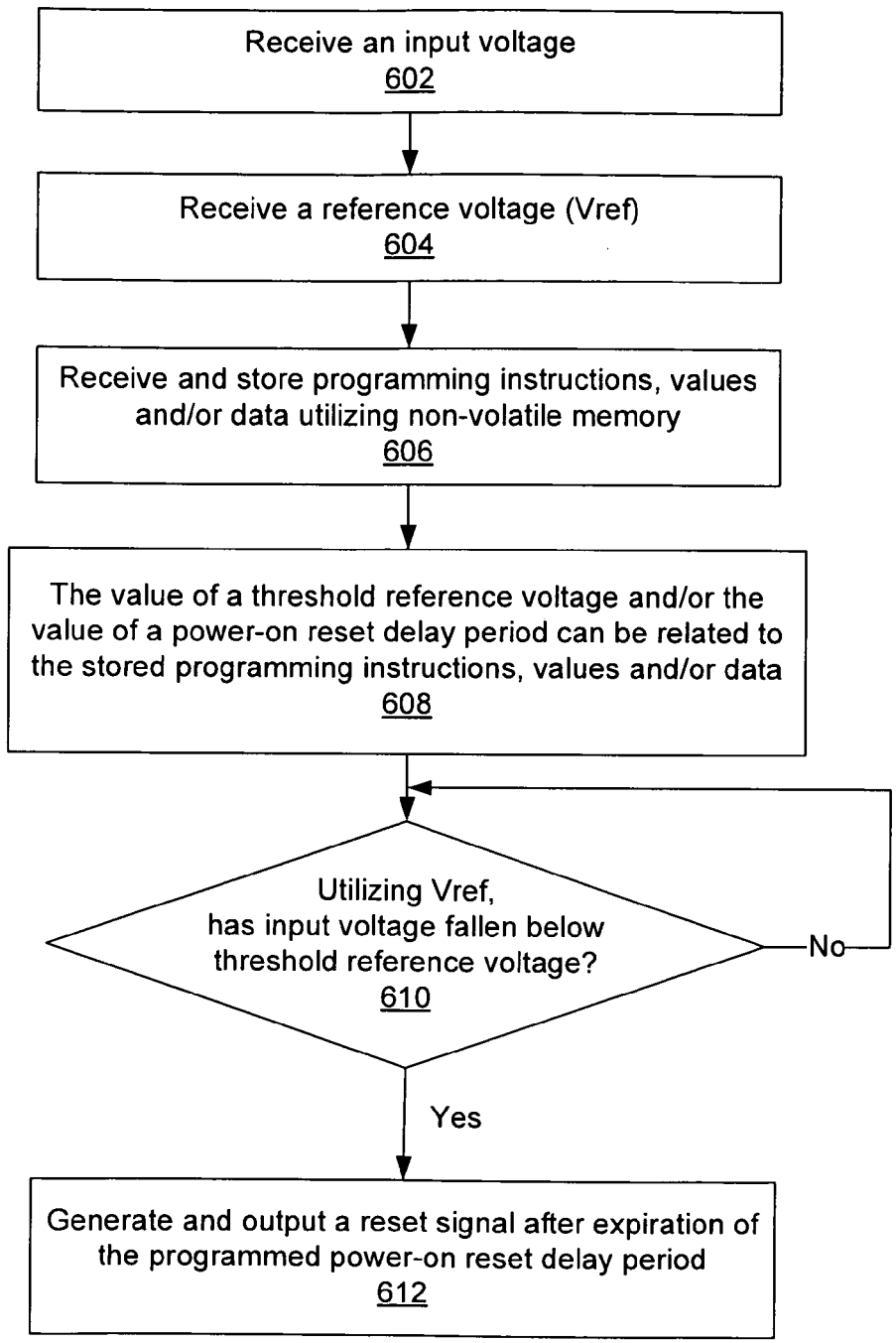
FIG. 6 is a flow diagram of an exemplary method in accordance with various embodiments of the invention.

FIG. 6 is a flow diagram of a method 600 in accordance with various embodiments of the invention for regulating a reset signal. Method 600 includes exemplary processes of various embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 600, such operations are exemplary. Method 600 may not include all of the operations illustrated by FIG. 6. Also, method 600 may include various other operations and/or variations of the operations shown by FIG. 6. Likewise, the sequence of the operations of method 600 can be modified. It is noted that the operations of method 600 can be performed by software, by firmware, by electronic hardware, or by any combination thereof.

Specifically, method 600 can include receiving an input voltage. Furthermore, a reference voltage can be received. Additionally, programming instructions, values and/or data can be received and stored utilizing non-volatile memory. The value of a threshold reference voltage and/or the value of a power-on reset delay period can be related to the stored programming instructions, values and/or data. Moreover, utilizing the reference voltage, a determination can be made as to whether the input voltage has fallen below the threshold reference voltage. If so, a reset signal can be generated and output after the elapse or expiration of the programmed power-on reset delay period. However, if it is determined that the input voltage has not fallen below the programmed threshold reference voltage, the determination can be repeated. In this manner, the reset signal can be regulated.

At operation 602 of FIG. 6, an input voltage (e.g., 106) can be received. Note that operation 602 can be implemented in a wide variety of ways. For example in one embodiment, at operation 602 input voltage can be received via one or more pins (e.g., 340) of an integrated circuit (e.g., 300, 400 or 500) by a programmable supervisor module (e.g., 110, 302, 402 or 502). Operation 602 can be implemented in any manner similar to that described herein, but is not limited to such.

At operation 604, a reference voltage (e.g., Vref 312 or 512) can be received. Operation 604 can be implemented in a wide variety of ways. For example in an embodiment, at operation 604 the reference voltage can be received by the programmable supervisor module. Operation 604 can be implemented in any manner similar to that described herein, but is not limited to such.

At operation 606 of FIG. 6, programming instructions, values and/or data can be received and stored utilizing non-volatile memory (e.g., 308). It is noted that operation 606 can be implemented in a wide variety of ways. For example in an embodiment, at operation 606 the programming instructions, values and/or data can be received and stored by the non-volatile memory via a programming interface (e.g., 122), wherein the non-volatile memory can be a component of the programmable supervisor module. Operation 606 can be implemented in any manner similar to that described herein, but is not limited to such.

At operation 608, the value of a threshold reference voltage and/or the value of a power-on reset delay period can be related to the stored programming instructions, values and/or data. Note that operation 608 can be implemented in a wide variety of ways. For example in one embodiment, at operation 608 the stored programming instructions, values and/or data can establish or set the value of the threshold reference voltage and/or the value of the power-on reset delay period of the programmable supervisor module. It is pointed out that in an embodiment, at operation 608 the stored programming instructions, values and/or data can establish or set other functionality (e.g., glitch rejection period, low voltage interrupt value, watch-dog timer count, etc.) of the programmable supervisor module. Operation 608 can be implemented in any manner similar to that described herein, but is not limited to such.

At operation 610 of FIG. 6, utilizing the reference voltage, a determination can be made as to whether the input voltage has fallen below the threshold reference voltage. If not, process 600 can proceed to operation 610. However, if it is determined at operation 610 that the input voltage has fallen below the threshold reference voltage, process 600 can proceed to operation 612. Note that operation 610 can be implemented in a wide variety of ways. For example, operation 610 can be implemented in any manner similar to that described herein, but is not limited to such.

At operation 612, a reset signal (e.g., 124) can be generated and output after the elapse or expiration of the programmed power-on reset delay period. It is noted that operation 612 can be implemented in wide variety of ways. For example in an embodiment, the reset signal can be generated and output by the programmable supervisor module after the elapse or expiration of the programmed power-on reset delay period. Operation 612 can be implemented in any manner similar to that described herein, but is not limited to such. At the completion of operation 612, process 600 can be exited.

Figure 7:
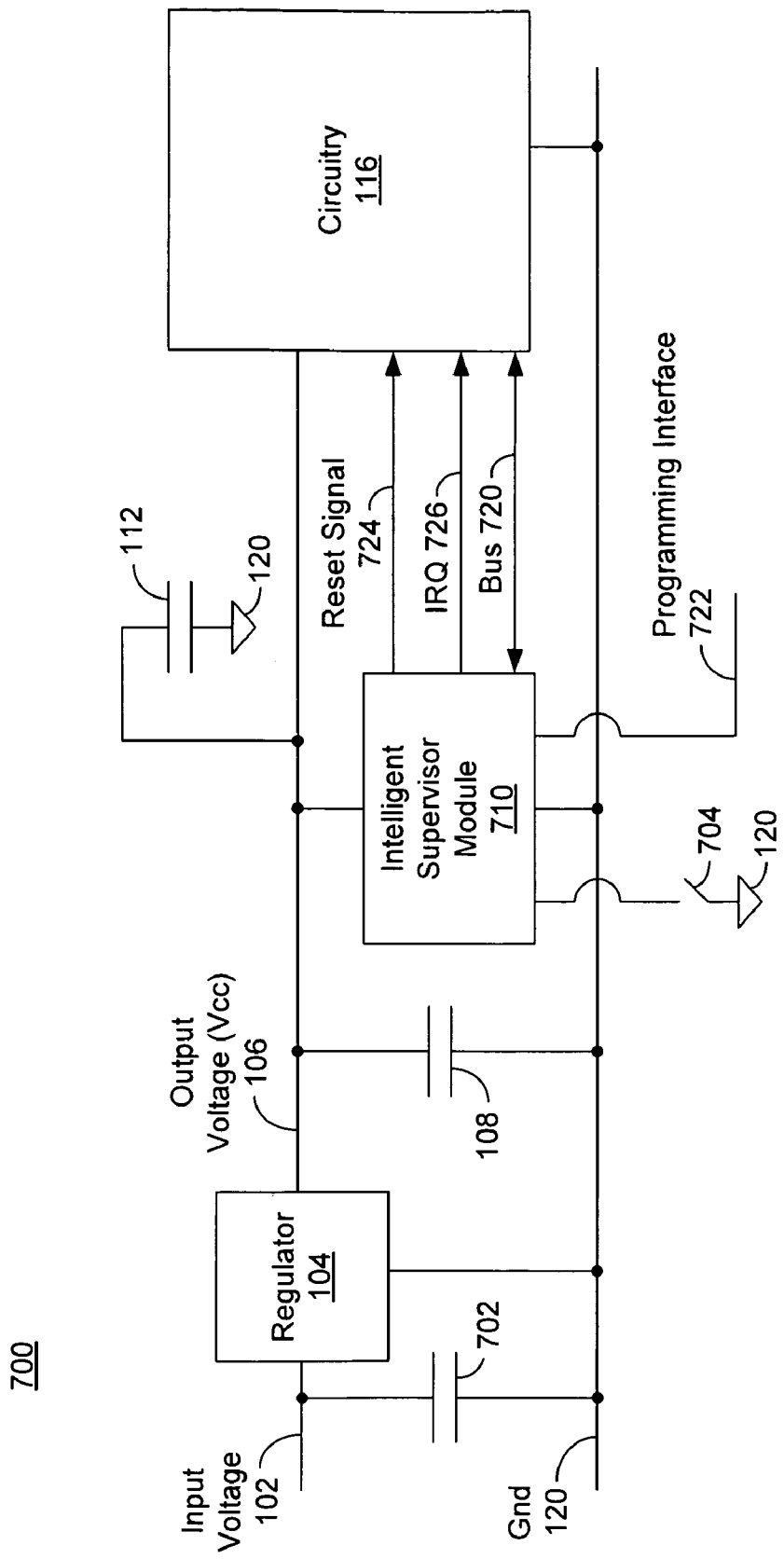
FIG. 7 is a diagram of another exemplary system in accordance with various embodiments of the invention.

FIG. 7 is a diagram of an exemplary system 700 in accordance with various embodiments of the invention. Specifically in one embodiment, the system 700 can include an intelligent supervisor module 710, which can function as a power-on reset (POR) circuit that is intelligent and dynamic. It is pointed out that the elements of system 700 having the same reference numbers as the elements of any other figure can operate or function in any manner similar to that described herein, but are not limited to such. It is noted that the intelligent supervisor module 710 can offer programmable threshold reference voltage and also programmable delay, as discussed herein, with the addition of further programmability and intelligent supervisory functions. The intelligent supervisor module 710 may be based on a mixed signal microcontroller and therefore may have an integrated processing element (e.g., CPU). The intelligent supervisor module 710 can offer programmable glitch rejection where the duration and magnitude of the glitch can be programmed. Based on this programmability, the intelligent supervisor module 710 would be resistant to voltage logic level changes (e.g., would not generate a reset signal 724), depending on its programming.

Additionally, the intelligent supervisor module 710 can adjust its trip voltage depending on the state of the system 700. Therefore, if the system 700 is in sleep mode, then the trip voltage of the intelligent supervisor module 710 can be reduced because the circuitry 116 is in a mode that does not need the higher voltage. In one embodiment, the intelligent supervisor module 710 may be programmed with a normal trip voltage (high) and a sleep mode trip voltage (low). It is noted that the communication bus 720 (e.g., serial interface) can be used to notify the intelligent supervisor module 710 of the current sleep/operational state of the system 700.

Within FIG. 7, by utilizing the intelligent supervisor module 710, a proper voltage supply can be maintained for the system 700 and hazards avoided. For example in an embodiment, the intelligent supervisor module 710 can provide programmable delays for any change in trip voltage upon the start of a sleep interval. In one embodiment, any logic level change of any pin may cause the intelligent supervisor module 710 to exit sleep mode and re-establish the high trip voltage. It is noted that in an embodiment, entry into the sleep mode may be based on a command to the intelligent supervisor module 710 from the system 700 while exit from the sleep mode may be by the intelligent supervisor module 710 detecting a logic level change (system signal) on any system pin.

Additionally, in one embodiment, the intelligent supervisor module 710 of system 700 may be implemented with an integrated sleep timer that is programmable. In this embodiment, the intelligent supervisor module 710 may exit sleep mode by detecting a logic level change on a system pin, or by a programmable timer expiring. In this embodiment, with the sleep timer located in the intelligent supervisor module 710, the intelligent supervisor module 710 can wake the system 700 thereby allowing the system 700 to enter a very deep low power sleep mode. The sleep timer of the intelligent supervisor module 710 can be combined with the ability to alter the trip voltage. Therefore, upon timer expiration, the intelligent supervisor module 710 can raise its internal voltage threshold and after some delay, it can interrupt the system 700, e.g., wake it up. On entering sleep, the intelligent supervisor module 710 can lower its trip voltage and wait for timer expiration.

Within FIG. 7, it is noted that in one embodiment the intelligent supervisor module 710 is intelligent in the sense that it can be reconfigured on-the-fly during device operation. The system 700 can include, but is not limited to, the voltage regulator circuit 104, intelligent supervisor module 710, circuitry 116, programming interface 722, and capacitors 708, 108 and 112. Specifically, the voltage regulator circuit 104 can include a voltage input 102 and a voltage output 106, which can have a positive voltage value. Note that in one embodiment of system 700, voltage regulator 104 and input voltage 102 can be replaced by one or more batteries. The voltage input 102 can be coupled to a first terminal of capacitor 702 while voltage ground 120 can be coupled to a second terminal of capacitor 702. The voltage output 106 of the voltage regulator can be coupled to a first terminal of the capacitor 108, a first terminal of the intelligent supervisor module 710, a first terminal of the capacitor 112, and a first terminal of the circuitry 116. Furthermore, the system 700 can include a voltage ground (Gnd) 120. The voltage ground 120 can be coupled to a third terminal of the voltage regulator 104, a second terminal of the capacitor 108, a second terminal of the intelligent supervisor 710, and a second terminal of the circuitry 116. A third terminal of the intelligent supervisor 710 can be coupled to a reset input (not shown) of the circuitry 116. As such, the programmable supervisor 110 can output and the circuitry 116 can receive the reset signal 724. Moreover, a fourth terminal of the intelligent supervisor module 710 can be coupled to an interrupt request (IRQ) of the circuitry 116. As such, the intelligent supervisor module 710 can transmit an interrupt request (IRQ) signal 726 to the circuitry 116. Also, a fifth terminal of the intelligent supervisor module 710 can be coupled to a communication bus or interface 720, which is coupled to the circuitry 116. As such, the intelligent supervisor module 710 can be in communication with the circuitry 116. Additionally, the programming interface 122 can be coupled to the intelligent supervisor module 710. It is noted that the communication bus 720 can be implemented in a wide variety of ways. For example, the communication bus 720 can be implemented in any manner similar to the programming interface 122 as described herein, but is not limited to such.

It is noted that the system 700 can operate in any manner similar to systems 100 and/or 200, but is not limited to such. However, the intelligent supervisor module 710 of the system 700 can include a processing element (e.g., 804) thereby enabling it to communicate and dynamically change, for example, the threshold voltage of the intelligent supervisor module 710. In one embodiment, a default reset threshold voltage can be set within the intelligent supervisor module 710 which can be programmed either before assembly or at the test stage of the circuit board assemble. As such, every time the system 700 is powered up, it can default to the programmed default reset threshold voltage. However, whenever it comes out of reset, the intelligent supervisor module 710 can have the option to vary that threshold dynamically, but that may not be normally saved. In one embodiment, the intelligent supervisor module 710 can be allowed to change its default reset threshold voltage. Furthermore, in an embodiment, the intelligent supervisor module 710 can continue to learn from its surroundings. For example, the intelligent supervisor module 710 might detect that certain type of faults were prevalent around 3.05 V. As such, the intelligent supervisor module 710 might learn and determine that for more robust operation, it is going to change its default threshold from (for example) 3.05+/−0.05 V to 3.1+/−0.05 V in order to make things a little bit safer. In one embodiment, the intelligent supervisor module 710 can change its interrupt trip point from (for example) 3.05+/−0.05 V to 3.15+/−0.05 V. Moreover, in an embodiment, the intelligent supervisor module 710 can be implemented to include a data logging capability, such as, recoding information (for example) about the time between resets, or the time between low voltage threshold and reset threshold, or any other information. Note that this data could be accessed by a service technician to help debug system issues during field service or factory repair.

Within FIG. 7, in one embodiment the intelligent supervisor module 710 can potentially be in constant communication with the circuitry 116. Specifically, a processing element (e.g., 804) of the intelligent supervisor module 710 can potentially be in constant communication with the circuitry 116.

In one embodiment, it is pointed out that system 700 can be implemented such that it will go to sleep and wait for a user to press a button before it wakes up. As such, the system 700 can include a button that is represented by a switch 704. It is noted that a first terminal of the switch 704 can be coupled to the intelligent supervisor module 710 while a second terminal of the switch 704 can be coupled to voltage ground 120. In one embodiment, the intelligent supervisor module 710 can be implemented with an internal pull-up resistor (not shown) that is coupled to the first terminal of the switch 704. It is pointed out that the pull up resistor can be at a logic 1 voltage level. As such, when the button is pressed, which can cause the switch 704 to close, the processing element (e.g., 804) of the intelligent supervisor module 710 can wake up, assert reset signal 724, and coincident with that the intelligent supervisor module 710 can start supplying the running threshold.

It is understood that the system 700 may not include all of the elements illustrated by FIG. 7. Additionally, the system 700 can be implemented to include one or more elements not illustrated by FIG. 7.

Figure 8:
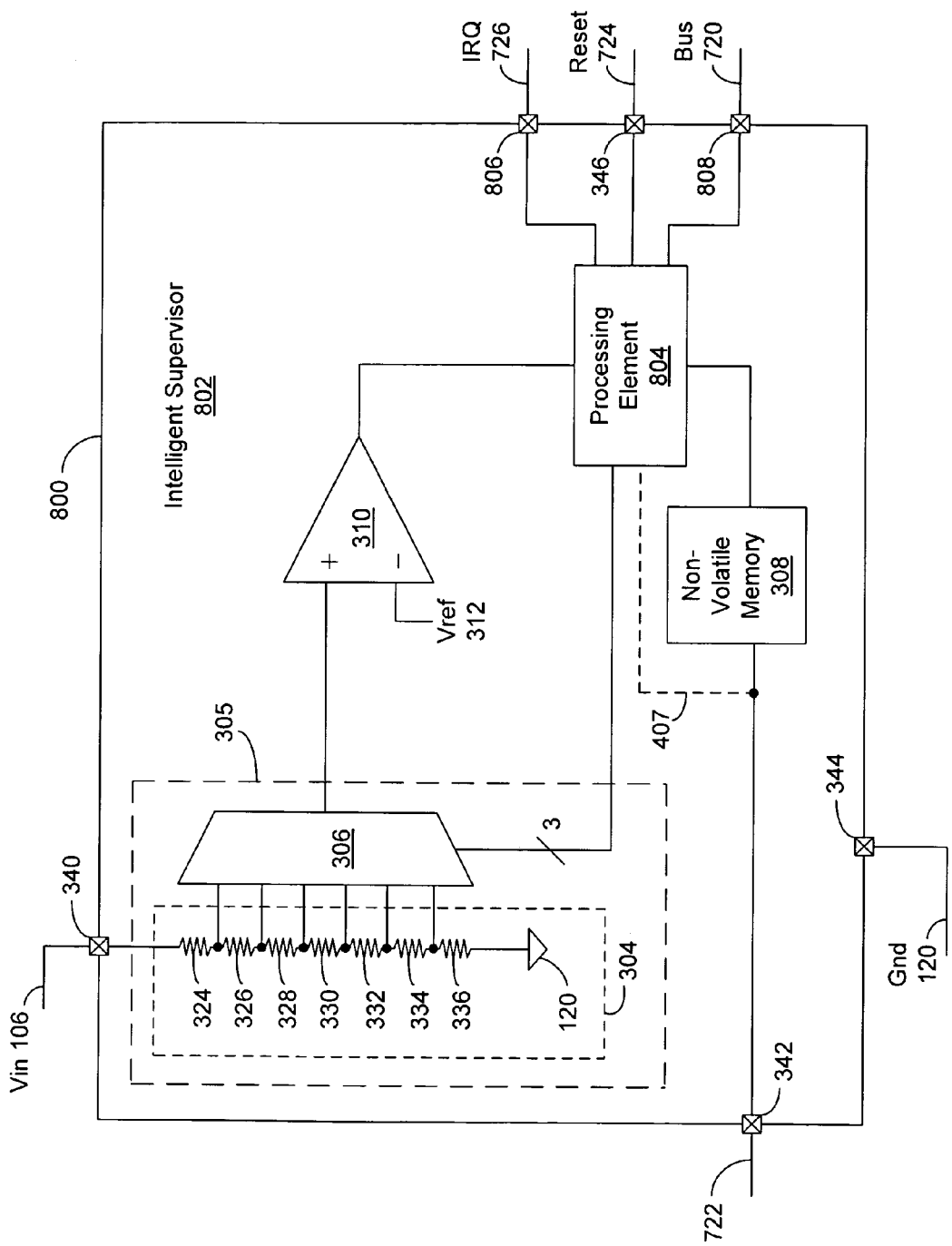
FIG. 8 is a diagram of an exemplary intelligent supervisor circuit in accordance with various embodiments of the invention.

FIG. 8 is schematic diagram of an exemplary intelligent supervisor circuit 802 in accordance with various embodiments of the invention. Note that the intelligent supervisor circuit 802 can be implemented as part of an integrated circuit 800. It is pointed out that the elements of FIG. 8 having the same reference numbers as the elements of any other figure can operate or function in any manner similar to that described herein, but are not limited to such. In an embodiment, the intelligent supervisor circuit 802 can be an implementation of the intelligent supervisor module 710 of FIG. 7. The intelligent supervisor circuit 802 of FIG. 7 can include, but is not limited to, voltage divider 304, multiplexer 306, processing element 804, non-volatile memory 308, and comparator 310. Note that in one embodiment the programming interface 122 can be coupled to the non-volatile memory 308 via the programming interface pin 342 of the integrated circuit 800. In an embodiment, the programming interface 122 and programming interface pin 342 can be coupled to the processing element 804 as indicated by dashed line 407. It is noted that if the processing element 804 is coupled to the programming interface 122, then the processing element 804 can receive and manage the storing of any programming instructions, values and/or data within the non-volatile memory 308. The processing element 804 can be implemented in a wide variety of ways. For example, the processing element 804 can include, but is not limited to, a central processing unit, a microprocessor, any type of processing element that can execute instructions, and the like. It is pointed out that the intelligent supervisor circuit 802 can include a programmable voltage divider 305, which can be implemented in a wide variety of ways. For example in an embodiment, the programmable voltage divider 305 can include the voltage divider 304 and multiplexer 306, but is not limited to such.

The processing element 804 of the intelligent supervisor circuit 802 can be coupled to a reset pin 346 of the integrated circuit 800 for outputting a reset signal 724. Also, the processing element 804 of the intelligent supervisor circuit 802 can be coupled to an interrupt request (IRQ) pin 806 of the integrated circuit 800 for outputting an interrupt request signal 726. Furthermore, the processing element 804 of the intelligent supervisor circuit 802 can be coupled to a communication bus pin 808 of the integrated circuit 800 for communicating over the communication bus 720. Note that the communication bus 720 can be implemented in a wide variety of ways. For example, the communication bus 720 can be implemented in any manner similar to the programming interface 122 of FIG. 1, but is not limited to such. It is pointed out that communication bus 720 can be utilized in any manner similar to communication bus 204 as described herein, but is not limited to such.

Within FIG. 8, in one embodiment, during the operation of the processing element 804 of the intelligent supervisor circuit 802, it is pointed out that the processing element 804 has the ability to dynamically vary (or change) one or more characteristics (e.g., voltage threshold, glitch rejection interval, delay period, watch-dog timer, and the like). It is pointed out that one of the reasons for changing the glitch rejection interval is that the system (e.g., 700) may have different operating modes. For example in one embodiment, the circuitry 116 may be controlling a motor and it might experience significant power supply glitching while the motor is running. However, it may not be desirable to set a very large glitch rejection window when the system 700 is not actively driving the motor because that could result in the voltage potentially sinking a long way. So dependent on the activity of the circuitry 116, it might be causing noise itself. As such, if the processing element 804 of the intelligent supervisor circuit 802 knows that it is going to cause noise, the processing element 804 could make the system 700 more tolerant. In an embodiment, if the processing element 804 knows that there should not be any noise, it can make the system 700 reset on smaller glitches.

It is understood that the intelligent supervisor circuit 802 may not include all of the elements illustrated by FIG. 8. Additionally, the intelligent supervisor circuit 802 can be implemented to include one or more elements not illustrated by FIG. 8.

Figure 9:
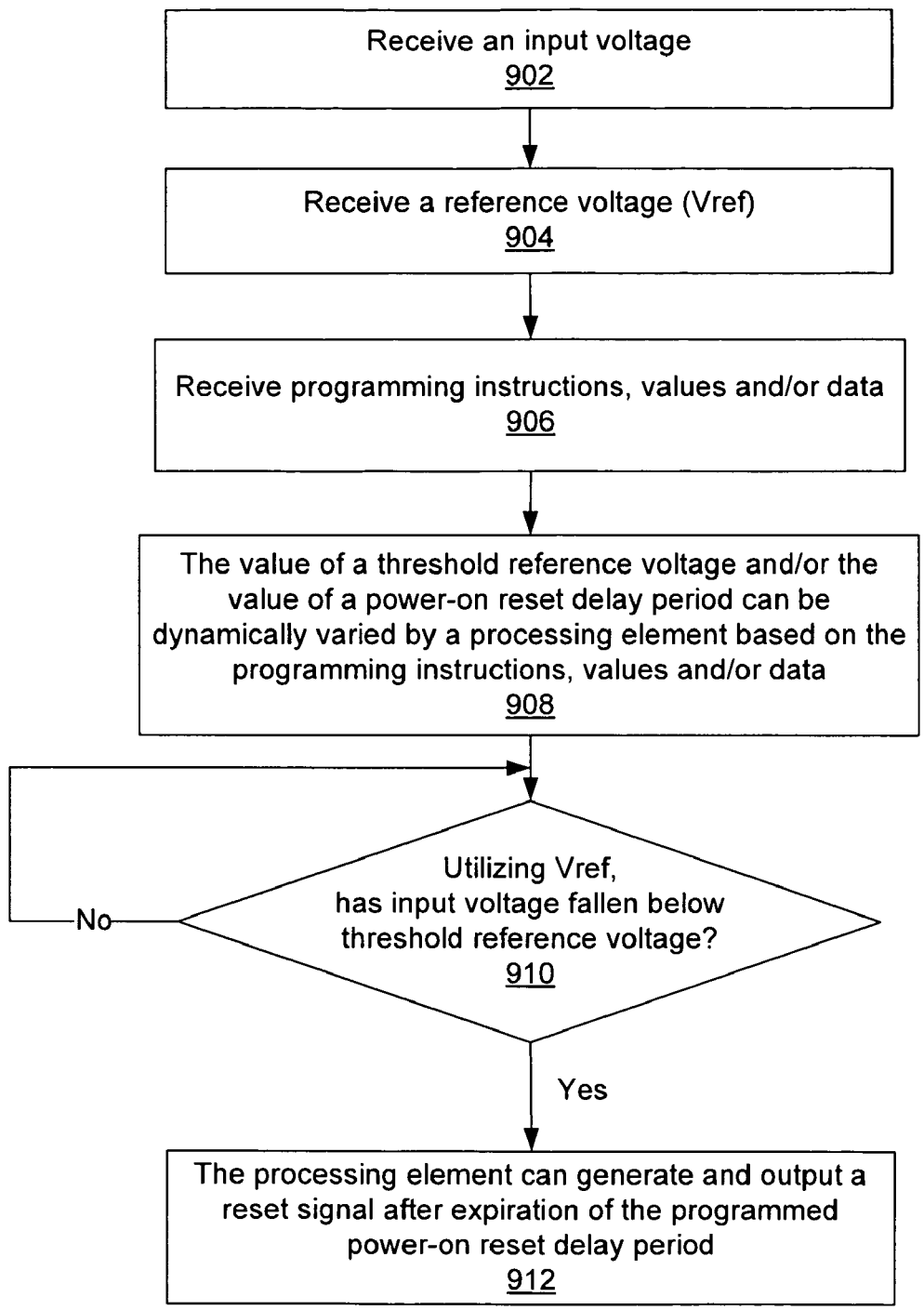
FIG. 9 is a flow diagram of another exemplary method in accordance with various embodiments of the invention.

FIG. 9 is a flow diagram of a method 900 in accordance with various embodiments of the invention for dynamically regulating a reset signal. Method 900 includes exemplary processes of various embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 900, such operations are exemplary. Method 900 may not include all of the operations illustrated by FIG. 9. Also, method 900 may include various other operations and/or variations of the operations shown by FIG. 9. Likewise, the sequence of the operations of method 900 can be modified. It is noted that the operations of method 900 can be performed by software, by firmware, by electronic hardware, or by any combination thereof.

Specifically, method 900 can include receiving an input voltage. Additionally, a reference voltage can be received. Furthermore, programming instructions, values and/or data can be received. The value of a threshold reference voltage and/or the value of a power-on reset delay period can be dynamically varied (or changed) by a processing element based on the programming instructions, values and/or data. Utilizing the reference voltage, a determination can be made as to whether the input voltage has fallen below the threshold reference voltage. If so, the processing element can generate and output a reset signal after the elapse or expiration of the programmed power-on reset delay period. However, if it is determined that the input voltage has not fallen below the programmed threshold reference voltage, the determination can be repeated. In this manner, the reset signal can be dynamically regulated.

At operation 902 of FIG. 9, an input voltage (e.g., 106) can be received. Note that operation 902 can be implemented in a wide variety of ways. For example in one embodiment, at operation 902 the input voltage can be received via one or more pins (e.g., 340) of an integrated circuit (e.g., 800) by an intelligent supervisor module (e.g., 802). Operation 902 can be implemented in any manner similar to that described herein, but is not limited to such.

At operation 904, a reference voltage (e.g., Vref 312) can be received. Operation 904 can be implemented in a wide variety of ways. For example in an embodiment, at operation 904 the reference voltage can be received by the intelligent supervisor module. Operation 904 can be implemented in any manner similar to that described herein, but is not limited to such.

At operation 906 of FIG. 9, programming instructions, values and/or data can be received. It is pointed out that operation 906 can be implemented in a wide variety of ways. For example in one embodiment, at operation 906 programming instructions, values and/or data can be received and stored by non-volatile memory (e.g., 308) via a programming interface (e.g., 122) or a communication bus (e.g., 720), wherein the non-volatile memory can be a component of the intelligent supervisor module. In an embodiment, at operation 906 programming instructions, values and/or data can be received by a processing element (e.g., 804) via a programming interface (e.g., 122) or a communication bus (e.g., 720), wherein the processing element can be a component of the intelligent supervisor module.

At operation 908, the value of a threshold reference voltage and/or the value of a power-on reset delay period can be dynamically varied (or changed) by a processing element (e.g., 804) based on the programming instructions, values and/or data. Note that operation 908 can be implemented in a wide variety of ways. For example in one embodiment, at operation 908 the processing element can dynamically vary (or change) the value of the threshold reference voltage and/or the value of the power-on reset delay period of the intelligent supervisor module based on the programming instructions, values and/or data. It is pointed out that in an embodiment, at operation 908 the processing element can dynamically vary (or change) one or more characteristics (e.g., voltage threshold, glitch rejection interval, watch-dog timer, etc.) of the intelligent supervisor module based on the programming instructions, values and/or data. Operation 908 can be implemented in any manner similar to that described herein, but is not limited to such.

At operation 910 of FIG. 9, utilizing the reference voltage, a determination can be made as to whether the input voltage has fallen below the threshold reference voltage. If not, process 900 can proceed to operation 910. However, if it is determined at operation 910 that the input voltage has fallen below the threshold reference voltage, process 900 can proceed to operation 912. Note that operation 910 can be implemented in a wide variety of ways. For example, operation 910 can be implemented in any manner similar to that described herein, but is not limited to such.

At operation 912, the processing element can generate and output a reset signal (e.g., 724) after the elapse or expiration of the programmed power-on reset delay period. It is noted that operation 912 can be implemented in wide variety of ways. For example in an embodiment, the reset signal can be generated and output by the processing element (that is a component of the intelligent supervisor module) after the elapse or expiration of the programmed power-on reset delay period. Operation 912 can be implemented in any manner similar to that described herein, but is not limited to such. At the completion of operation 912, process 900 can be exited.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A programmable power-on reset circuit comprising:
 a programmable voltage divider;
 a comparator coupled to the programmable voltage divider and coupled to receive a reference voltage;
 a non-volatile memory coupled to the programmable voltage divider, the non-volatile memory coupled to receive programming for controlling an output of the programmable voltage divider; and
 a delay module coupled to the comparator and the non-volatile memory.

2. The programmable power-on reset circuit of claim 1, wherein the programming sets a delay period of the delay module.

3. A programmable power-on reset circuit comprising:
 a programmable voltage divider;
 a comparator coupled to the programmable voltage divider and coupled to receive a reference voltage;
 a non-volatile memory coupled to the programmable voltage divider, the non-volatile memory coupled to receive programming for controlling an output of the programmable voltage divider; and
 a glitch detection module coupled to the comparator and the non-volatile memory.

4. The programmable power-on reset circuit of claim 3, wherein the programming sets a glitch detection interval for the glitch detection module.

5. A programmable power-on reset circuit comprising:
 programmable voltage divider;
 a comparator coupled to the programmable voltage divider and coupled to receive a reference voltage; and
 a processing element coupled to the programmable voltage divider, the processing element coupled to receive programming for controlling an output of the programmable voltage divider; and
 a non-volatile memory coupled to the processing element, the non-volatile memory for storing the programming.

6. The programmable power-on reset circuit of claim 5, wherein the processing element generates a reset signal.

7. The programmable power-on reset circuit of claim 5, wherein the programming sets a delay period implemented by the processing element.

8. The programmable power-on reset circuit of claim 5, wherein the programming sets a glitch detection interval implemented by the processing element.

9. The programmable power-on reset circuit of claim 5, wherein the processing element is coupled to the comparator.

10. A method comprising:
 receiving an input voltage;
 storing programming data with non-volatile memory, the programming data sets a threshold reference voltage; and
 outputting a reset signal if the input voltage falls below the threshold reference voltage,
 wherein the programming data sets a delay period associated with the outputting the reset signal.

11. The method of claim 10, wherein the programming data sets a glitch rejection period associated with the outputting the reset signal.

* * * * *